United States Patent [19]
Del Signore et al.

[11] Patent Number: 6,002,355
[45] Date of Patent: *Dec. 14, 1999

[54] SYNCHRONOUSLY PUMPED SUBSTRATE ANALOG-TO-DIGITAL CONVERTER (ADC) SYSTEM AND METHODS

[75] Inventors: Bruce Del Signore, Hollis; Qicheng Yu, Nashua, both of N.H.; Jerome E. Johnston, Austin, Tex.

[73] Assignee: Cirrus Logic, Inc., Fremont, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/883,364

[22] Filed: Jun. 26, 1997

[51] Int. Cl.$^6$ ...................................................... H03M 1/00
[52] U.S. Cl. ........................... 341/155; 341/172; 327/534
[58] Field of Search .................................... 327/333, 534, 327/535, 536, 537, 538; 341/172, 155

[56] References Cited

U.S. PATENT DOCUMENTS

| | | | |
|---|---|---|---|
| 4,471,290 | 9/1984 | Yamaguchi | 327/534 |
| 4,794,278 | 12/1988 | Vajdic | 327/534 |
| 5,266,842 | 11/1993 | Park | 327/354 |
| 5,770,964 | 6/1998 | Suma | 327/534 |

*Primary Examiner*—Howard L. Williams

[57] ABSTRACT

An analog-to-digital converter (ADC) architecture is fabricated on a semiconductor substrate which is negatively capacitively charge pumped below ground and subject to feedback regulation, rate measurements and adjustments. The ADC receives signal inputs of positive and negative polarity relative to ground, while being powered at 0V and 5V, without any negative power source input, as a result of a closed feedback loop which keeps the negative bias voltage constant as external supplies and component voltages vary. The high frequency pumping of the silicon substrate is subject to timing requirements which permit high resolution analog input signals to be converted in the presence of pump noise.

27 Claims, 5 Drawing Sheets

SYNCHRONOUSLY PUMPED SUBSTRATE ANALOG-TO-DIGITAL CONVERTER (ADC) SYSTEM AND METHODS

TECHNICAL FIELD

The field of this invention relates to synchronously pumped substrate analog-to-digital converter (ADC) systems and methods, and more particularly to ADC systems and methods adapted for receipt of both negative and positive input analog signals.

BACKGROUND

Analog-to-digital converters (ADCs) of many kinds have been used with various kinds of measurement systems. For examples, ADCs have been employed in sensors and transducers for thermocouple and piezoelectric sensor applications. Typically, such systems produce no voltage output signals at all, unless they are provided with a specific input such as heat or pressure. Input signals from such sensor applications are thus inherently ground-based. In other words, the input signals from the sensors express value levels with reference to a zero or ground potential. The signal input relative to ground may be positive or negative.

Performing analog-to-digital signal conversions on analog signals going below ground levels is particularly difficult with ADCs which run on 0V and 5V supplies only. A significant problem of these ADC systems is level shifting the negative and positive voltages produced by particular sensors and transducers when interfaced with single supply ADCs. Level shifting of low noise, high accuracy signals is expensive and complicated. In the past, only dual supply converters with positive and negative 5V supplies could convert negative analog voltage signals. In particular, measurement systems with analog front end circuits and ADCs have relied upon dual supply voltages. With dual supply voltages, circuits could be designed with components which could utilize both positive and negative power supply voltages. The power supply voltage levels at one time ranged from positive 15 to negative 15 volts. More recently, the range of voltages serving as power sources for semiconductor chips has diminished to positive 5 and negative 5 volts, or even, in some instances, to as low as 3 volts.

To protect sensitive analog circuitry on monolithic ADCs, large diodes have been connected to the input pin leads associated with the first and second ADC power supplies. In the case of a single supply being used as the semiconductor chip power source, the ADC diodes are connected respectively to ground potential and to VDD in order to protect the on-chip ADC circuitry. This protection is effective, because if the semiconductor chip input signal pin goes above or below the level of either of the predetermined supply voltages, the corresponding diode turns on. For example, if the input pin of the ADC is driven above the level of VDD or below the level of ground, a corresponding diode turns on and clamps the associated voltage at the VDD or ground level, as applicable. The diodes as configured accordingly are effective to protect the sensitive internal circuitry of the ADC. Since the turn-on voltage of each diode is approximately 0.6 volts in each case, an input pin to the ADC can in principle operably be taken below the level of ground. However, the diode turn-on action is not instantaneous, but subject to a non-linear exponential turn-on transfer curve. The nonlinearity of the transfer curve detrimentally affects ADC performance. However, without the diodes, the input pin becomes subject to damage from electrostatic discharge (ESD) events.

FIG. 1 is a diagram of a monolithic analog-to-digital converter (ADC) 7 according to the prior art. ADC 7 is conventionally connected impedance resistor 8, a source voltage 9, and a ground terminal 10. ADC 7 includes internal circuitry 7A, and first and second diodes respectively 7B and 7C, also respectively referred to as diodes D1 and D2. ADC 7 further includes respective first and second voltage connections 7D and 7E, respectively VDD and ground (GND), and an analog input connection 7F. Voltage connections 7D and 7E are according to one embodiment respectively connected to five volts (5V) and zero volts (0V). Diodes D1 and D2 are reverse biased and connected in series between VDD and ground, with the anode of diode D1 being connected to the cathode of diode D2. Further, the anode of diode D2 is connected to ground, and the cathode of diode D1 is connected to VDD. Source impedance resistor 8 is connected between analog input connection 7F and source voltage 9. Source voltage 9 is connected between ground 10 and source impedance 8. Diodes D1 and D2 are large in current carrying capacity to protect the sensitive analog circuitry of the monolithic ADC 7. In the case of a single supply, the diodes to both ground and VDD protect the on chip circuitry by forward biasing, if the input is driven above VDD or below ground. For example, if analog input connection or pin 7F is driven above VDD or below ground, one of the diodes turns on and clamps the pin 7F.

FIG. 2 is a current voltage characteristic curve diagram for a diode according to the prior art. As a result of this characteristic, a diode does not instantly turn on. When a particular diode is forward biased more than approximately 0.6 volts, it begins to conduct current. However, the turn-on current is highly non-linear.

It is accordingly desirable to develop an ADC circuit design which accommodates a range of input signal levels, including both positive and negative levels. Moreover, it is desired to create an ADC circuit which operates in a substantially linear mode, even when acting upon input analog voltage levels which traverse ground by having components that are positive as well as components which are negative in polarity. Further, it is desired that the ADC circuit design be effective for minimizing noise and increasing the signal-to-noise ratio of the overall circuit design.

SUMMARY OF THE INVENTION

According to the present invention, an analog-to-digital converter (ADC) system includes synchronously-pumped semiconductor substrate. The ADC system further includes circuitry which is able to pump the voltage potential level of the semiconductor substrate negatively below ground. The ADC circuitry according to the present invention receives input measurement signal levels which can have either a positive and negative polarity relative to ground at any given point in time, while being powered at 0V and 5V, without any negative power source input being provided.

DETAILED DESCRIPTION OF A PREFERRED EMBODIMENT OF THE INVENTION

Figure 1:
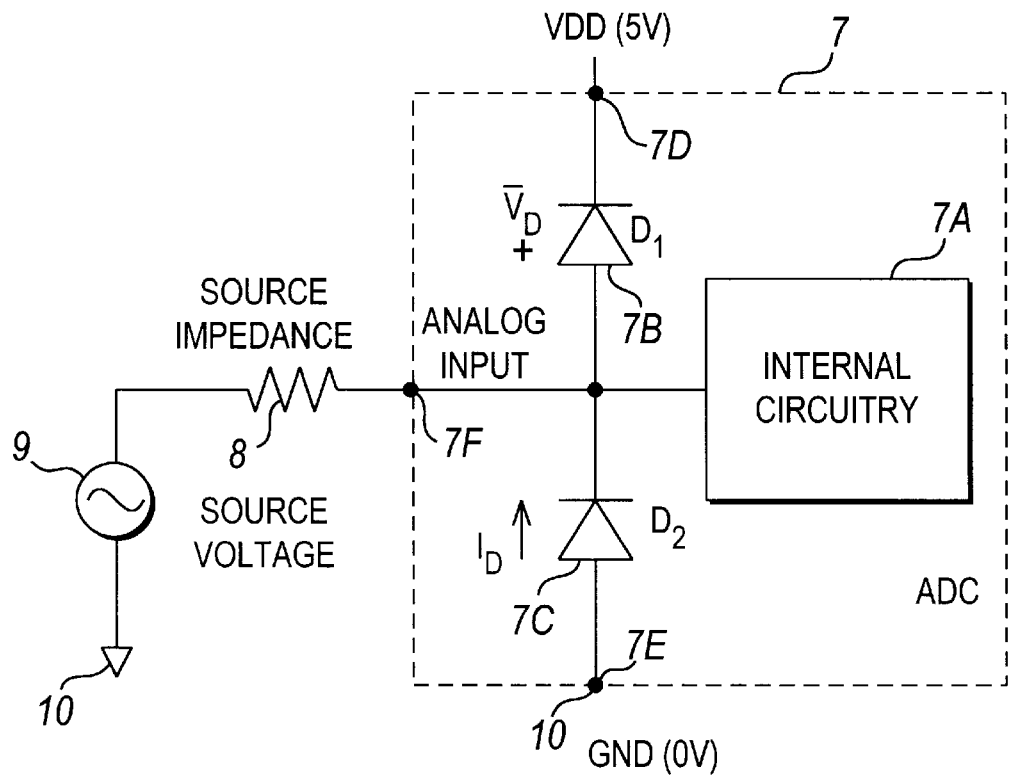
FIG. 1 is a diagram of a circuit according to the prior art including an analog to digital converter (ADC), a source impedance resistor, a source voltage.
Figure 2:
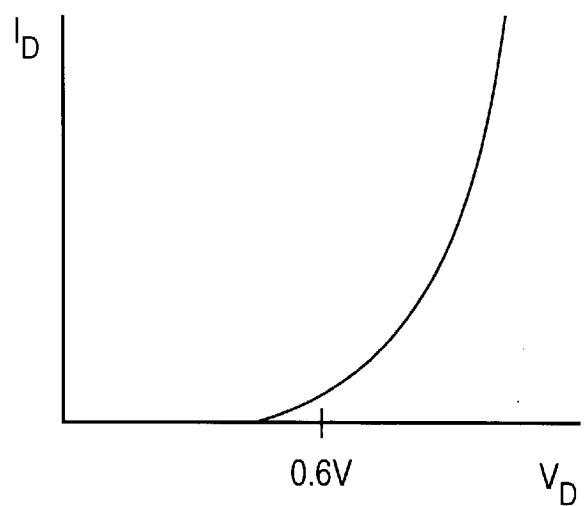
FIG. 2 is a current voltage characteristic curve diagram for a diode according to the prior art.
Figure 3:
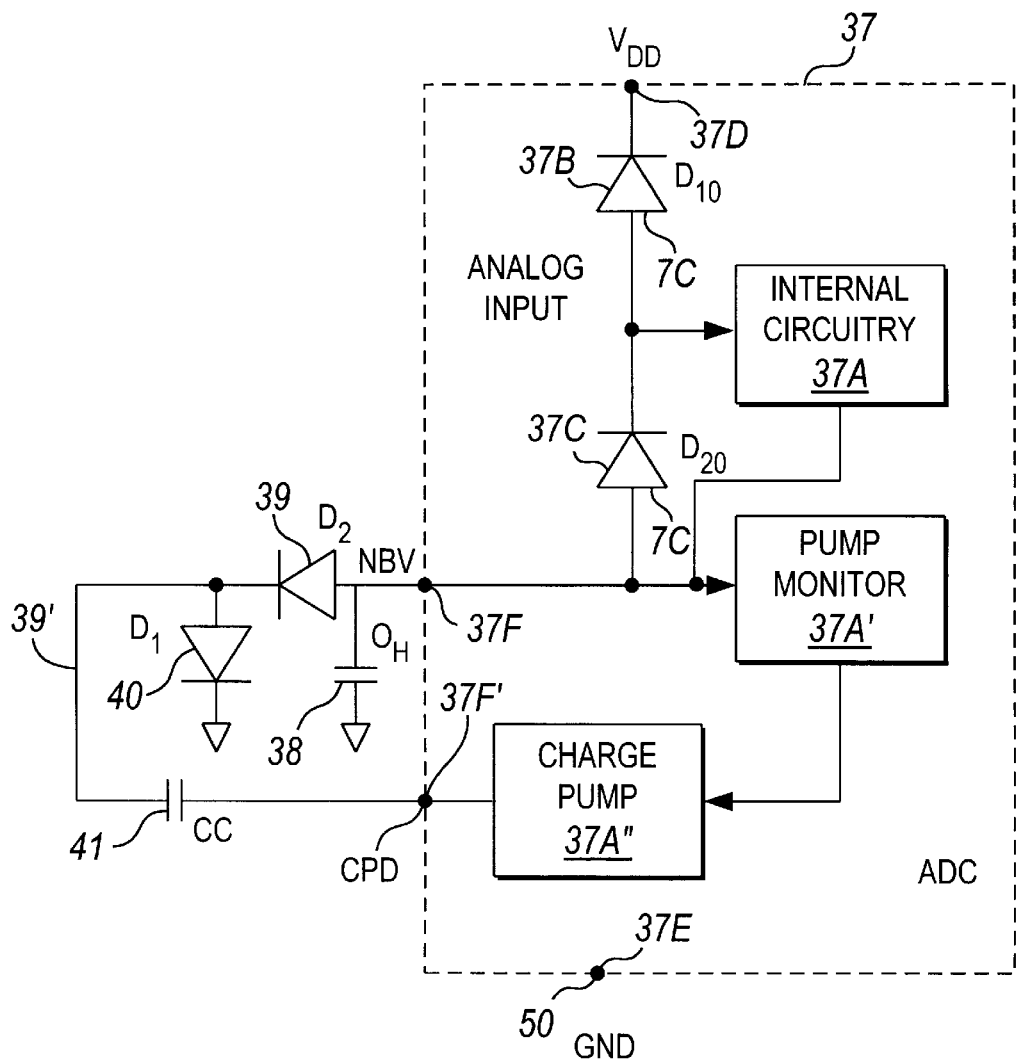
FIG. 3 is a diagram of an analog to digital converter (ADC) system according 36 to the present invention including an ADC, a charging capacitor, first and second diodes, a capacitor, and a ground connection.

FIG. 3 is a diagram of an analog to digital converter (ADC) system 36 according to the present invention, including an ADC 37, a holding capacitor 38, first and second diodes 39 and 40 connected at a common node 39', a capacitor 41, and a ground connection 50. ADC 37 includes internal circuitry 37A, and first and second protection diodes respectively 37B and 37C, also respectively referred to as diodes D10 and D20. ADC 37 further includes respective first and second voltage connections 37D and 37E, respectively VDD and GND, and a negative bias voltage (NBV) rail 37F and charge pump drive pin 37F'. Voltage connection 37D is according to one embodiment connected to five volts (5V). Diodes D10 and D20 are connected in series between VDD and a negative bias voltage (NBV) pin 37F, with the anode of diode D10 being connected to the cathode of diode D20. Further, the anode of diode D20 is connected to NBV, and the cathode of diode D1 is connected to VDD. Pump monitor 37A' and charge pump circuitry 37A" are connected between NBV rail 37F and CPD pin 37F'. Pump monitor 37A' is connected to NBV rail 37F, and charge pump circuit 37A" is connected to CPD pin 37F'. Holding capacitor 38 is connected between analog input connection 37F and diode 39. Diodes D2 and D1 are connected in series between NBV and ground, and to each other at a common node 39' which in turn is connected between capacitor 41 and diode D2. Capacitor 41 is connected between CPD pin 37F' and diode D1. According to the ADC system 36 of the present invention, ground referenced input signals can be received at signal ranges including voltages below ground, for analog to digital conversion by single supply ADC's. In particular, according to the present invention, charge pump circuitry 37A" is configured to be fabricated on the same chip as the ADC 37 and connected to an external holding capacitor and first and second diodes to pump a negative bias voltage (NBV) 37F rail to a predetermined negative voltage level. According to the present invention, first and second protection diodes respectively 37B and 37C (or other protection circuitry) are connected to the NBV rail 37F. The negative biasing of circuit elements and systems of the internal circuitry 37A is enabled according to the present invention, by connecting internal circuitry 37A to NBV rail 37F. According to one embodiment of the present invention, the NBV rail 37F is pumped to approximately −2.1 volts. Accordingly, input source voltages can have any value from the selected NBV rail setting to VDD and not cause appreciable nonlinear protection diode turn-on currents which would tend to corrupt the linearity of ADC measurements. Charge pump circuit 37A" is configured according to one embodiment of the present invention to produce a square wave at the CPD pin 37F'. This square wave operative on holding capacitor 38 and first and second diodes D2 and D1 causes the holding capacitor 38 to be pumped below ground until it reaches a particular steady state voltage level. The square wave, according to one embodiment, has a maximum value of VDD and a minimum value of about zero. Pump monitor circuit 37A' according one embodiment of the present invention is configured to compare the pumped voltage, NBV, with a predetermined reference voltage level, and is configured to regulate the waveform at the CPD pin to maintain the NBV voltage within predetermined bounds. The pump monitor circuit 37A' accordingly counteracts variations in capacitor values and pump diode turn-on voltages, as well as variations in the absolute value of VDD or variations and drifts caused by time and temperature, which can change the negative bias voltage level on the NBV rail 37F.

Figure 4:
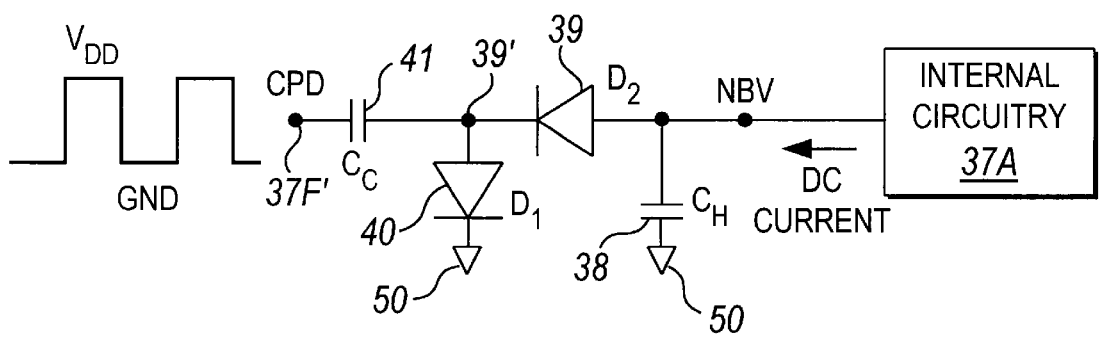
FIG. 4 is a diagram of an expanded analog to digital converter (ADC) system according to the present invention including an ADC, a charging capacitor, first and second diodes, a capacitor, and a ground connection.

FIG. 4 is a diagram of an expanded version of an analog-to-digital converter (ADC) system 36 according to the present invention including an ADC 37, a holding capacitor 38, first and second diodes 39 and 40, a capacitor 41, and a ground connection 50. Holding capacitor 38 is connected between NBV rail 37F and diode 39. Diodes D2 and D1 are connected in series between NBV rail 37F and ground, and to each other at a common node 39' which in turn is connected between capacitor 41 and diode D2. Capacitor 41 is connected between CPD pin 37F' and diode D1. If the direct current (i.e., a "dc" current) is zero for internal circuitry 37A, and further assuming a charge pump drive (CPD) produces square wave variations of amplitude between VDD and zero, when the voltage at NBV rail 37F is zero, and as the CPD signal transitions from ground to VDD, current flows into diode D1 and clamps the voltage at node 39' to 0.6 volts. Since the voltage at NBV rail 37F is zero, the diode D2 is revere biased and remains turned off and non-conducting. After a CPD transition, NBV stays at zero volts. Then, as CPD transitions from VDD to ground, node 39' follows the CPD pin and turns off diode D1. Then, diode D2 turns on and discharges capacitor 38, bringing the voltage at NBV rail 37F below ground to a predetermined voltage level. Over several charge pump drive transitions, the NBV voltage is negatively pumped in repeated stair transitions until a steady state is reached. The equation of the steady state NBV voltage is NBV=− VDD +2* VD, where VD is the diode turn-on voltage or approximately 0.6 volts. Accordingly, NBV=− 5+(2*.6)=− 3.8 volts. After steady state is reached, when CPD transitions from ground to VDD, diode D1 turns on, setting clamping node 39' to 0.6 volts. Diode D2 is off, because it is reverse biased with −3.6−0.6=−4.4 volts across it. Since diode D2 is off, the voltage at NBV rail 37F remains at −3.8 volts. When CPD transitions from VDD to ground, node 39' moves negative, until it reaches −4.4 volts, after which time diode D2 turns on and pulls the voltage at NBV rail 37 to −3.8 volts. If internal ADC circuitry 37A uses the negative bias voltage (NBV), charge pump 37A" also supplies an adequate amount of direct current to the internal ADC circuitry 37A. For example, assuming about 400 microampere of current is used by internal ADC circuitry 37A, assuming a holding capacitance of 10 microfarad and a capacitor 41 capacitance of seven nanofarads, and assuming a pumping frequency of 32,768 Hertz, the 400 microampere current will discharge the capacitor 41 according to the equation deltaV= deltaT*IDC/CC, where deltaV is the voltage drop on capacitor 41 during the time period deltaT due to the direct current, IDC. Accordingly, NBV=IDC*deltaT/CC−VDD+2* VD= (400*30.5)/7000−5+2*.6=−2.06 volts. The resulting waveform on the NBV pin has a sawtooth shape to it. NBV is pumped to −2.06 volts and then linearly moves toward zero due to the dc current discharging holding capacitor 38. The next pump cycle then pumps the voltage back to −2.06 volts.

The value of the holding capacitor 38 is determined by specifying the maximum amount of voltage discharge allowed between pump cycles according to the relationship deltaV=deltaT*IDC/CH. According to the example above, the value of the amplitude of the discharge between pump cycles would be 1.22 millivolts. If the direct current and the maximum discharge voltage result in a small value for the holding capacitor 38, the respective capacitors and diodes can be implemented on the ADC chip, eliminating the need for off-chip circuitry according to the present invention.

Figure 5:
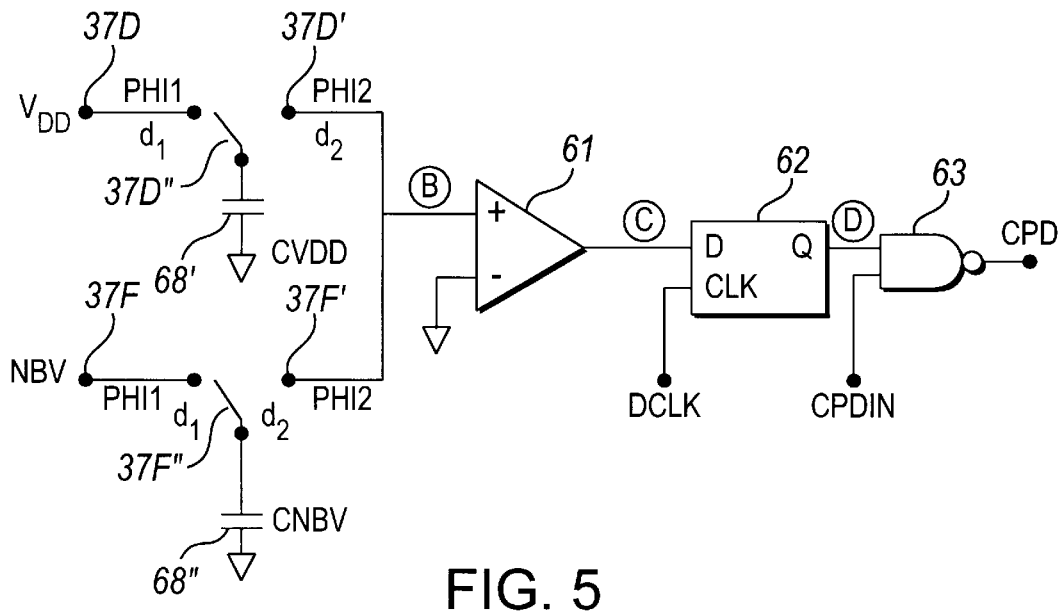
FIG. 5 is a pump monitor circuit according to the present invention.

FIG. 5 is a pump monitor circuit 56 according to the present invention, connected between VDD, the negative bias voltage (NBV) rail 37F, a ground connection, and the charge pump drive (CPD) node. Pump monitor circuit 56 further comprises first and second switches 37D" and 37F", respectively corresponding first and second sampling capacitors 68' and 68", a differential amplifier 61, a latch 62, and a NAND gate 63. The pump monitor circuit 56 is used to detect and counteract the variations which can cause undesired changes in the negative bias voltage, such as component particularities and time and temperature drift effects, for example, without limitation. First switch 37D" includes first and second connections phi1 and phi2 and is connected to first sampling capacitor 68", i.e., CVDD; and second switch 37F" includes first and second connections phi1 and phi2 and is connected to second sampling capacitor 68', i.e., CNBV. First connection phi1 of first switch 37D" is connected to VDD, and first connection phi1 of second switch 37F" is connected to NBV. Second connections phi2 of first and second switches 37D" and 37F" are connected to node B and to the positive terminal of amplifier 61. The negative terminal of amplifier 61 is connected to ground. Latch 62 has first, second, and third terminals, which are labeled respectively as D, Q, and CLK (i.e., clock). NAND gate 63 has first and second input connections. Amplifier 61, latch 62, and NAND gate 63 are connected in series between nodes B and CPD. Amplifier 61 is connected at node C to terminal D of latch 62. The clock terminal of latch 62 is connected to node DCLK, and the Q terminal of latch 62 is connected to the first input connection of NAND gate 63. The second input connection of NAND gate 63 is connected to CPDIN. The output of NAND gate 63 is connected to CPD.

Figure 6:
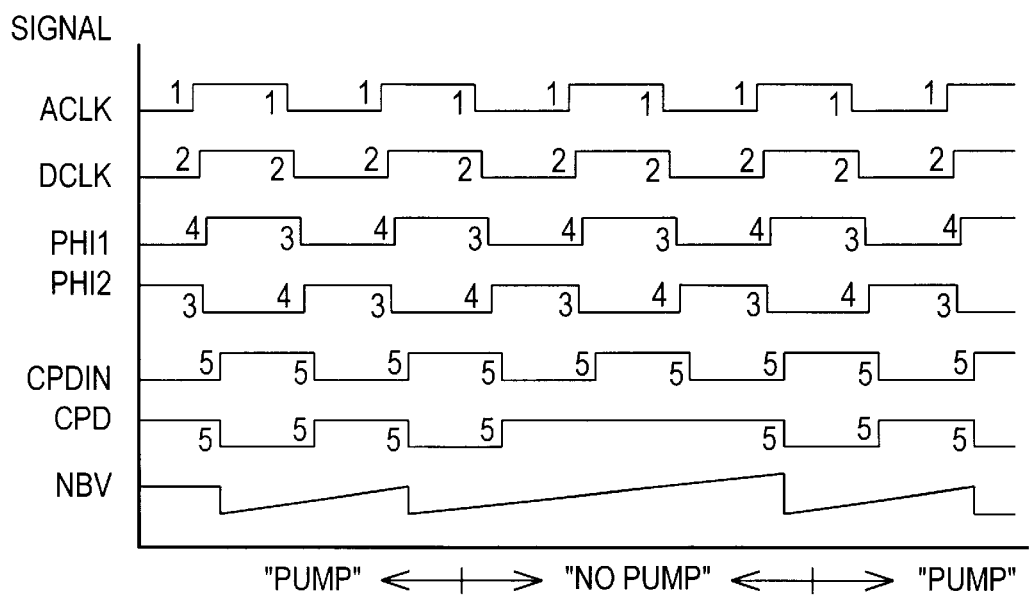
FIG. 6 is a timing diagram describing the operation of switching circuit of FIG. 5.

FIG. 6 is a timing diagram describing the operation of switching circuit 56 of FIG. 5. In particular, FIG. 6 shows the relative timing of successive first and second edges of circuit signals including clock signals ACLK and DCLK, switch signals phi1 and phi2, and node voltage levels CPDIN, CPD, and NBV, as indicated in FIG. 5. As shown in FIG. 6, the edges of clock signals ACLK and DCLK rise and fall with each other at substantially the same times with periodic regularity, except that DCLK is somewhat delayed with respect to ACLK. Similarly, switch signal phi1 substantially tracks the rise and fall times of clock signal DCLK. Switch signal phi1 is substantially opposite in polarity to switch signal phi2, and phi2 falls before phi1 rises, and rises after phi2 falls. CPDIN substantially tracks phi2, subject to a slight delay. CPD generally tracks the complement of CPDIN, except that it may stay positive for an extended period to lengthen a no-pumping period, as shown in FIG. 5. NBV is a ramp signal showing periods of pumping and not pumping actions in relationship to the signal values of CPDIN and CPD. Since the substrate of the ADC, now has a sawtooth waveform shape instead of being tied to a "quiet ground," the possibility of noise being coupled into the sensitive analog processing circuitry on the ADC is present. By careful and synchronous timing of the pump circuitry, the coupling of high frequency noise which degrades the analog performance is minimized. The ADC uses a three tiered timing scheme to minimize noise. On the first tier, the critical analog sampling occurs with ACLK. During this time, the digital circuitry on the ADC is quiet and the NBV voltage is noise free and has a linear discharge shape. Next, the digital circuitry is allowed to transition on DCLK which causes transient spikes on the VDD and GND supplies on the ADC. Finally, the charge pump circuit is allowed to pump the ADC substrate on the CPD edge. This couples additional high frequency transient noise spikes on the ADC. This noise is allowed to settle out before the next analog sampling edge of ACLK. The ADC Circuit according to the present invention shows no degradation in performance when the pump is turned on compared to tying the NBV pin to an external −2.1 volt low noise power supply. There are many variables in the above equations which can change the value of NBV. Component tolerances and drift effects will cause the value of NBV to change over time and temperature. In order to keep the value of NBV constant, a pump monitor circuit according to the present invention is included on the ADC. It can be shown that the two sampling capacitors CNBV and CVDD can be used to compare the value of NBV with respect to VDD and change the waveform of the CPD signal. In one embodiment, VDD=5V, CNBV=2.38pF and CVDD=1 pF. The sampling capacitors are ratioed in such a way that:

$$NVB = -(VDD * CVDD)/CNBV$$
$$= -(5.0 * 1 \text{ pF})/2.38 \text{ pF}$$
$$= -2.1 \text{ volts.}$$

This capacitive sampling scheme is one embodiment according to the present invention, but any method of comparing NBV to a reference voltage is within the scope of this invention. If NBV is more negative than −2.1V, the voltage on node B will be negative after the capacitive sampling event. The output of the comparator, i.e. node C, is a logic zero. The output of the flip-flop, i.e. node D, is a logic zero upon the next transition of DCLK. The output of the NAND gate, CPD, will not transition for any value of CPDIN, thereby eliminating one pump cycle. This elimination effectively changes the duty cycle of the CPD waveform and controls the value of NBV. CH will continue to discharge until the value of NBV is less negative than −2.V, at which time node B will be positive. The output of the comparator, node C, will be a logic one and the output of the flip-flop, node D will transition to a logic one on the next positive transition of DCLK. This will enable the CPD signal which will pump CH back to −2.1V. The CPD waveform during the "pump condition" is also shown in FIG. 6. In one embodiment, the values for respective external components according to the present invention are: D1=1 N4148, D2=1 N4148, CC=15nF, and CH=10uF. The NBV voltage can also be changed by modifying the amplitude of the CPD signal instead of changing its duty cycle.

The ADC circuitry according to the present invention further engages in closed feedback loop regulation according to which output rate measurements and adjustments are made to produce a feedback signal which is provided at the input of the ADC circuitry. The use of this closed feedback regulation system ensures operational stability of the ADC semiconductor substrate, because output levels are prevented from destabilizing. According to one embodiment of the present invention, the potential level of the semiconductor chip substrate is voltage shifted to about two volts below ground by use of capacitive pumping action of the feedback system of the ADC circuitry. Accordingly, the input signal to be converted from an input analog level to an output digital signal is provided subject to a negative substrate bias voltage instead of to a ground or zero bias voltage level.

Figure 7:
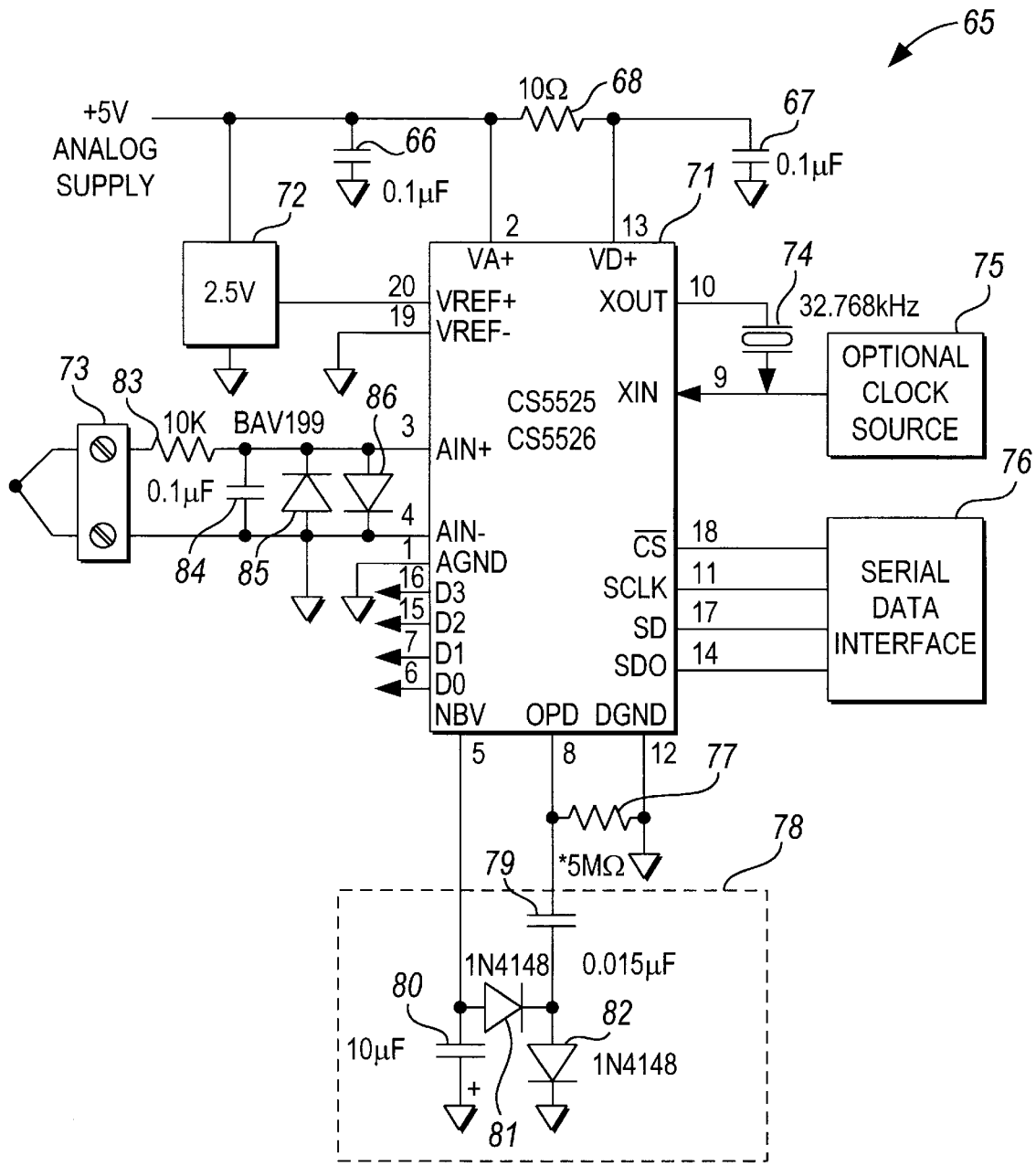
FIG. 7 is a diagram of an ADC system 65 according to one embodiment of the present invention.

FIG. 7 is a diagram of an ADC system 65 according to one embodiment of the present invention. In particular, ADC system 65 includes a first capacitor 66, a first resistor 68, a second capacitor 67, and an ADC chip 71. ADC system 65 further includes a 2.5 Volt source 72, a thermocoupler 73, an oscillator crystal 74. an optional clock source 75, a serial data interface 76, a second resistor 77, and a charge pump circuit 78 according to the present invention, in turn including a third capacitor 79, a fourth capacitor 80, a first diode 81, and a second diode 82. ADC system 65 further includes a third resistor 83, a fifth capacitor 84, a third diode 85, and a fourth diode 86. The ADC chip 71 is available from Cirrus Logic, Inc., under product names CS5525 and CS5526. The CS5525 and CS5526 are 16-bit and 20-bit pin compatible converters which include a chopper-stabilized instrumentation amplifier input, and an on-chip programmable gain amplifier. They are both optimized for measuring low-level unipolar or bipolar signals in process control and medical applications. The CS5525/26 also includes a fourth order delta-sigma modulator, a calibration microcontroller, a digital filter with selectable decimation rates, a 4-bit digital latch, and a serial port. The digital filter can be set to any one of eight different output update rates when the chip is operating from a 32.768 kHz watch crystal or equivalent clock. The CS5525/26 include a (CPD) charge pump drive output which provides a negative bias voltage to the on-chip instrumentation amplifier when used with a combination of external diodes and capacitors. This enables the CS5526/26 to measure negative voltages with respect to ground, making it ideal for thermocouple temperature measurements. The CS5525/26 A/D converters operate from a single +5V analog supply with several different input ranges. FIG. 7 illustrates the CS5525/26 connected to generate its own negative bias supply using the on-chip CPD (Charge Pump Drive). This enables the CS5525/26 to measure ground referenced signals with magnitudes down to −2.5V. The ADC chip 71 is provided with power from a +5 Volts analog supply connected to first capacitor 66 and first resistor 68. First and second capacitors respectively 66 and 67 are connected to respective first and second side of resistor 68 at input connections 2 and 13 of ADC chip 71. ADC chip connection 20 is connected to 2.5 voltage source 72, and ADC chip connection 19 is connected in series with resistor 83 to respective ADC chip connections 3 and 4. Diodes 85 and 86 are connected oppositely parallel to each other and parallel to capacitor 4 between connections 3 and 4. Connection 4 is grounded. Charge pump circuit 78 is connected to ADC chip 71 at respective connectors 5 and 8. Resistor 77 is connected between connections 8 and 12. Serial data interface 76 is connected to ADC chip 71 at 14, 17 and 18. Oscillator crystal 74 is connected between input connections 9 and 10, and optional clock source 75 is connected at connection 9 to ADC chip 71.

Figure 8:
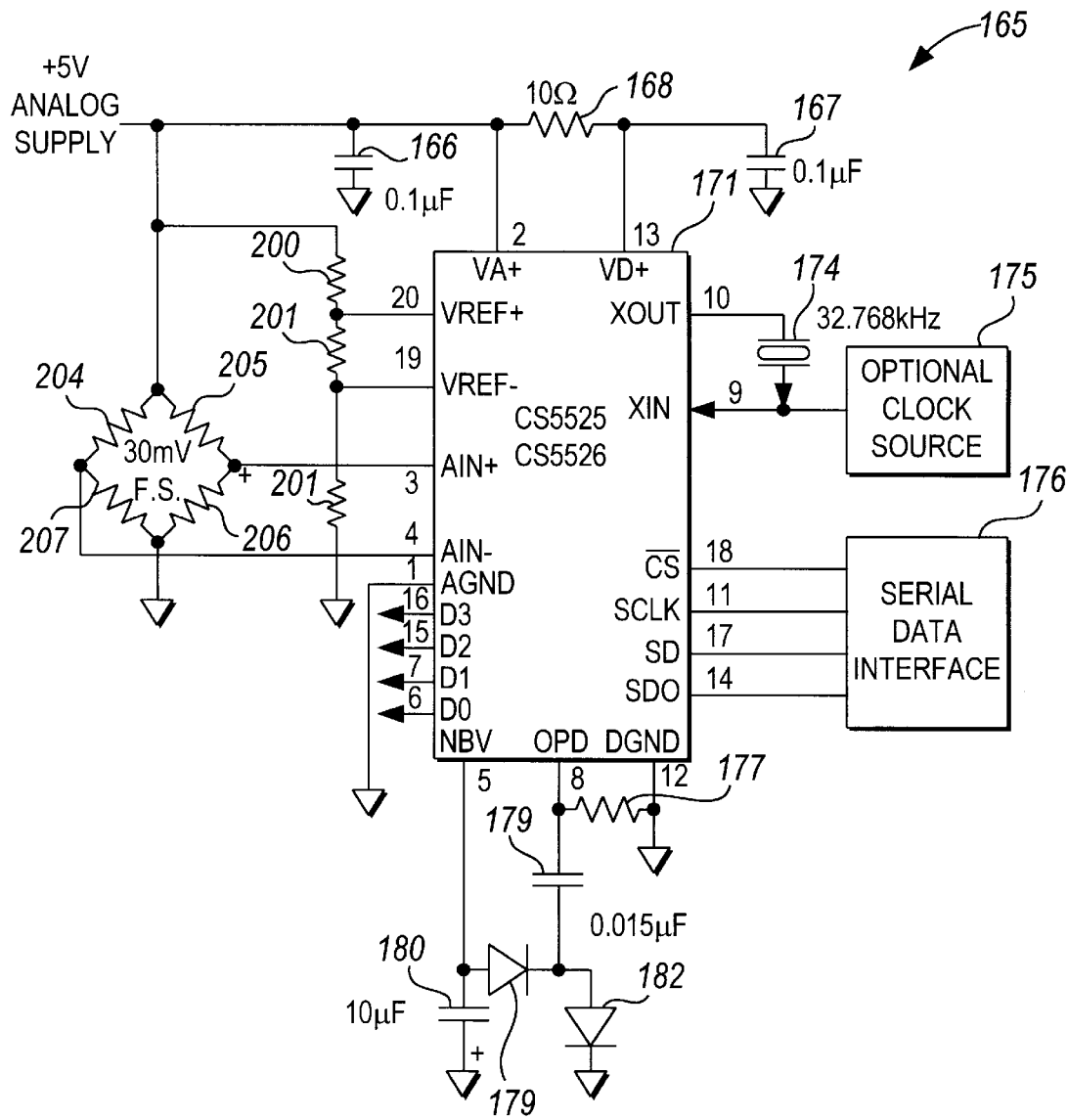
FIG. 8 is a diagram of an ADC system 165 according to one embodiment of the present invention.

FIG. 8 is a diagram of an ADC system 165 according to one embodiment of the present invention. In particular, ADC system 165 includes a first capacitor 166, a first resistor 168, and a second capacitor 167, and an ADC chip 171. ADC system 165 further includes an oscillator crystal 174, an optional clock source 175, a serial data interface 76, a second resistor 177, and a charge pump circuit 178 according to the present invention, in turn including a third capacitor 179, a fourth capacitor 180, a first diode 181, and a second diode 182. ADC system 165 further includes a bridge transducer having first and second pairs of resistors 204–207; and connected in series between the power supply and ground, resistors 200–202. Resistor 201 is connected at respective input and output nodes to ADC chip connections 20 and 19. Resistors 204 and 207 are connected to each other at a common node which is connected to ADC chip connection 4. Resistors 205 and 206 are connected to each other at a common node which is connected to ADC chip connection 3. When power to chip CS5525 or CS5526 is applied, the chip is held in a reset condition until the 32.768 kHz oscillator has started and a countertimer elapses. Due to the high Q of the 32.768 kHz crystal, the oscillator takes 400–600 ms to start. The counter-timer counts 1003 oscillator clock cycles to make sure the oscillator is fully stable. During this time-out period the serial port logic is reset and the RV (Reset Valid) bit in the configuration register is set. A reset can be initiated at any time by writing a logic I to the RS (Reset System) bet in the configuration register. This automatically sets the RV bit until the configuration register is read. After a reset, the on-chip registers are initialized to the following states and the converter is ready to perform conversions. The CS5525/26 includes a microcontroller with five registers used to control the converter. Each register is 24-bits in length except the 8-bit command register (command, configuration, offset, gain, and conversion data). After a system initialization or reset, the serial port is initialized to the command mode and the converter stays in this mode until a valid 8-bit command is received (the first 8-bits into the serial port). Once a valid 8 bit command (a read or a write command word) is received and interpreted by the command register, the serial port enters the data mode. In data mode the next 24 serial clock pulses shift data either into or out of the serial port 72 serial clock pulses are needed if set-up register is selected. The ADC chip 171 is provided with power from a +5 Volt analog supply connected to first capacitor 166 and first resistor 168. First and second capacitors respectively 166 and 167 are connected to respective first and second sides of resistor 168 at input connections 2 and 13 of ADC chip 171. ADC chip connection 20 is connected between resistors 200 and 201, and chip connection 19 is connected between resistors 201 and 202. The charge pump circuit 178 is connected to ADC chip 171 at respective connectors 5 and 8.Resistor 177 is connected to ADC chip 71 and respective connectors 11,14, 17 and 18. Oscillator crystal 174 is connected between input connectors 9 and 10, and optional clock source 175 is connected at connection 9 to ADC chip 171.

What is claimed is:

1. An analog-to-digital converter (ADC) system adapted for reception of electric power from first and second voltage sources, said first voltage source being connected to VDD and said second voltage source being connected to ground, said ADC system comprising:

a semiconductor substrate (SS);

an ADC fabricated on the SS and coupled to receive electric power from said first and second voltage sources and to a negative bias rail of the SS; and a charge pump circuit (CPC) coupled to said SS and a selected portion of said ADC, said CPC configured to pump a predetermined level of negative voltage to said negative bias rail of said SS.

2. The ADC system according to claim 1 wherein said CPC additionally comprises a diode and a capacitor, for pumping a negative voltage.

3. The ADC system according to claim 1 further comprising a monitor circuit for monitoring charge levels at a selected portion of said ADC.

4. An analog-to-digital converter (ADC) circuit system comprising:
- an ADC circuit having input and output signal connections;
- a semiconductor substrate having a controllable voltage potential level, said ADC circuit being fabricated on said semiconductor substrate and coupled to said semiconductor substrate for receiving the controllable voltage potential level; and
- a pumping circuit effective for producing a charge pumping action at a predetermined location of said semiconductor substrate.

5. The ADC circuit system according to claim 4 further comprising a feedback circuit which monitors output signals received from said ADC circuit.

6. The ADC circuit system according to claim 4 including a circuit configured for regulating the voltage level of said semiconductor substrate.

7. The ADC circuit system according to claim 4 further including circuitry configured for producing a feedback signal provided at an input signal location of said ADC circuit.

8. The ADC circuit system according to claim 4 further including circuitry effective for engaging in feedback loop regulation.

9. The ADC circuit system according to claim 4 wherein the potential level of the semiconductor chip substrate is voltage shifted to about two volts below ground.

10. A method of biasing a semiconductor substrate, said method including:
- detecting output signals at a signal output of an analog-to-digital converter circuit;
- applying a negative voltage bias to the semiconductor substrate upon which said analog-to-digital converter circuit is fabricated, the level of the negative voltage bias being a function of the output signals detected; and
- applying an input signal to the analog-to-digital converter circuit based on the negative voltage bias and a first voltage, the output signal being representative of the input analog signal using the first voltage, said ground, and said negative voltage bias.

11. The method according to claim 10 including applying said negative voltage bias in separate bursts.

12. The method according to claim 10 including applying said negative voltage bias in frequency synchronization with the analog-to-digital converter circuit.

13. The method according to claim 10 including applying a non-negative voltage to said analog-to-digital substrate.

14. The method according to claim 13 including providing first and second voltages to said analog-to-digital substrate.

15. The method according to claim 14 wherein said first voltage is VDD and said second voltage is set to a ground potential.

16. The method according to claim 15 wherein the value of VDD is on the order of five (5) volts.

17. An analog-to-digital converter (ADC) system provided with electric power from first and second voltage sources, said first voltage source being connected to VDD and said second voltage source being connected to ground, said ADC system comprising:
- a semiconductor substrate (SS);
- an ADC fabricated on the SS and coupled to receive electric power from said first and second voltage sources and to a negative bias rail of the SS;
- a protection circuit for said ADC; and
- a charge pump circuit (CPC) coupled to a said SS and to a selected portion of said ADC, said CPC configured to pump a predetermined level of negative voltage to said negative bias rail of said selected portion of said ADC.

18. The ADC system according to claim 17 wherein the protection circuit includes first and second diodes.

19. The ADC system according to claim 17 further comprising a capacitor effective for pumping the SS to a predetermined negative voltage level.

20. An analog-to-digital converter (ADC) circuit system comprising:
- an ADC circuit having input and output signal location connections;
- a synchronously-pumped semiconductor substrate having a controllable voltage potential level, said ADC circuit being fabricated on said synchronously-pumped semiconductor substrate and coupled to said semiconductor substrate for receiving the controllable voltage potential level; and
- a pumping circuit effective for producing a high frequency charge pumping action at a predetermined location to alter the controllable voltage potential level of said synchronously-pumped semiconductor substrate.

21. The ADC circuit system according to claim 20 further comprising a feedback circuit which monitors output digital signals from said ADC circuit and which is effective for applying input signals for adjusting the potential of said synchronously-pumped semiconductor substrate.

22. The ADC circuit system according to claim 20 including a circuit configured for regulating the voltage level of said synchronously-pumped semiconductor substrate.

23. The ADC circuit system according to claim 20 including circuitry effective for producing a feedback signal which is provided at an input signal location of said ADC circuit.

24. The ADC circuit system according to claim 20 including circuitry effective for engaging in feedback loop regulation according to which output rate measurements and adjustments are made.

25. The ADC circuit system according to claim 20 wherein the potential level of the semiconductor chip substrate is voltage shifted below ground by a capacitive pumping action.

26. An analog-to-digital converter comprising:
- a semiconductor substrate fabricated to include an analog-to-digital converter; and
- a timing mechanism coupled to said semiconductor substrate for pumping a predetermined level of negative voltage to said semiconductor substrate to control a voltage level of an input signal applied to the analog-to-digital converter and levels of conversion voltages of the analog-to-digital converter.

27. An analog-to-digital (ADC) system comprising:
- a semiconductor substrate having a negative bias rail;
- a charge pump circuit coupled to the negative bias rail for pumping a predetermined level of negative voltage to said negative bias rail, and
- an ADC fabricated on said semiconductor substrate and having first and second inputs for receiving a first voltage and a ground, respectively, having a third input coupled to the negative bias rail, having an input terminal for receiving an input analog signal, and having an output terminal for generating an output digital signal representative of the input analog signal using the first voltage, said ground, and said negative voltage.

* * * * *